(12) United States Patent
Chapman et al.

(10) Patent No.: US 12,367,142 B1
(45) Date of Patent: Jul. 22, 2025

(54) DECOMPRESSION ENGINE SUPPORTING LARGE MATCH OFFSETS USING EXTERNAL MEMORY

(71) Applicant: MELLANOX TECHNOLOGIES, LTD., Yokneam (IL)

(72) Inventors: Hillel Chapman, Ramat HaShofet (IL); Saleh Bohsas, Haifa (IL)

(73) Assignee: Mellanox Technologies, Ltd, Yokneam (IL)

(*) Notice: Subject to any disclaimer, the term of this patent is extended or adjusted under 35 U.S.C. 154(b) by 0 days.

(21) Appl. No.: 18/419,630

(22) Filed: Jan. 23, 2024

(51) Int. Cl.
*G06F 12/0802* (2016.01)
*H03M 7/30* (2006.01)
*H03M 7/42* (2006.01)

(52) U.S. Cl.
CPC ...... *G06F 12/0802* (2013.01); *H03M 7/3086* (2013.01); *H03M 7/425* (2013.01); *H03M 7/6005* (2013.01); *G06F 2212/45* (2013.01)

(58) Field of Classification Search
None
See application file for complete search history.

(56) References Cited

U.S. PATENT DOCUMENTS

| 9,252,805 | B1* | 2/2016 | Abali | H03M 7/6005 |
| 9,973,205 | B1* | 5/2018 | Weber | G06T 9/005 |
| 10,476,518 | B1* | 11/2019 | Chang | H03M 7/3086 |
| 2017/0109056 | A1* | 4/2017 | Gopal | H03M 7/6011 |
| 2020/0142642 | A1* | 5/2020 | Billa | G06F 3/0673 |
| 2021/0055932 | A1* | 2/2021 | Patel | H03M 7/3059 |

FOREIGN PATENT DOCUMENTS

WO   WO-2023082156 A1 *  5/2023  .......... H03M 7/3086

OTHER PUBLICATIONS

Yu et al. "Stateful Hardware Decompression in Networking Environment." Nov. 2008. ACM. ANCS '08. pp. 141-150.*
Dragojević et al. "FaRM: Fast Remote Memory." Apr. 2014. USENIX. NSDI '14. pp. 401-414.*

* cited by examiner

*Primary Examiner* — Nathan Sadler
(74) *Attorney, Agent, or Firm* — Meitar Patents Ltd.; Daniel Kligler

(57) ABSTRACT

A decompression apparatus includes a cache memory and a decoder. The decoder is to receive a compressed input data stream including literals and matches. Each literal represents a data value, and each match represents a respective sequence of literals by a respective offset pointing to a respective past occurrence of the sequence of literals. The decoder is to decompress the input data stream by replacing each match with the corresponding past occurrence, so as to produce an output data stream. In replacing a given match with the corresponding past occurrence, the decoder is to (i) when the offset indicates that the past occurrence is cached in the cache memory, retrieve the past occurrence from the cache memory, and (ii) when the offset indicates that the past occurrence is not contained in the cache memory, fetch the past occurrence from an external memory.

16 Claims, 3 Drawing Sheets

DECOMPRESSION ENGINE SUPPORTING LARGE MATCH OFFSETS USING EXTERNAL MEMORY

FIELD OF THE INVENTION

The present invention relates generally to data compression and decompression, and particularly to methods and systems for data decompression using a cache memory and an external memory.

BACKGROUND OF THE INVENTION

Many compression algorithms convert an uncompressed data stream into a compressed data stream comprising "literals" and "matches". A literal is an uncompressed data value, typically a byte. A match is a back-reference that replaces a past occurrence of a certain sequence of literals. A match typically specifies the offset to the past occurrence of the sequence it replaces, and the size of the sequence. In other words, when the compression algorithm identifies a sequence of literals that it already encountered earlier in the uncompressed data stream, it replaces the later occurrence with a "match" that points to the past occurrence. Since the matches are considerably smaller in size than the sequences they replace, the compressed data stream has a lower data rate than the uncompressed data stream. Examples of compression algorithms that use this format include LZ4, LZ77, Snappy, Zstandard and others.

SUMMARY OF THE INVENTION

An embodiment of the present invention that is described herein provides a decompression apparatus including a cache memory and a decoder. The decoder is to receive a compressed input data stream including literals and matches. Each literal represents a data value, and each match represents a respective sequence of literals by a respective offset pointing to a respective past occurrence of the sequence of literals. The decoder is to decompress the input data stream by replacing each match with the corresponding past occurrence, so as to produce an output data stream. In replacing a given match with the corresponding past occurrence, the decoder is to (i) when the offset indicates that the past occurrence is cached in the cache memory, retrieve the past occurrence from the cache memory, and (ii) when the offset indicates that the past occurrence is not contained in the cache memory, fetch the past occurrence from an external memory.

In some embodiments, the decoder is to decide whether or not the past occurrence is cached in the cache memory, by comparing the offset to a threshold. In some embodiments, in producing the output data stream, the decoder is to output the output data stream to the external memory, and to cache a recent portion of the output data stream in the cache memory.

In a disclosed embodiment, the decoder includes (i) a match detector, to detect the given match in the input data stream and send a request for the corresponding past occurrence to the external memory, (ii) a delay element, to delay the input data stream at least by an access latency of the external memory, and (iii) a data merger coupled to an output of the delay element, the data merger to merge the past occurrence fetched from the external memory into the delayed input data stream, thereby producing the output data stream.

In an example embodiment, the decoder is to fetch the past occurrence from the external memory by communicating with the external memory over a peripheral bus. In another embodiment, the decoder is to fetch the past occurrence from the external memory by communicating with the external memory over a network connection.

There is additionally provided, in accordance with and embodiment of the present invention, a decompression apparatus including a cache memory and a decoder. The decoder is to receive a compressed input data stream including literals and matches. Each literal represents a data value, and each match includes an offset value pointing to a corresponding past occurrence of a respective sequence of literals. The decoder is to decompress the input data stream by replacing each match with the corresponding past occurrence, so as to produce an output data stream. In replacing a given match with the corresponding past occurrence, the decoder is to (i) when the offset indicates that the past occurrence is cached in the cache memory, retrieve the past occurrence from the cache memory, and (ii) when the offset indicates that the past occurrence is not contained in the cache memory, fetch the past occurrence from an external memory.

There is further provided, in accordance with and embodiment of the present invention, a peripheral device including a host interface and a decompression engine including a cache memory. The host interface is to communicate with a host. The decompression engine is to receive a compressed input data stream including literals and matches. Each literal represents a data value, and each match represents a respective sequence of literals by a respective offset pointing to a respective past occurrence of the sequence of literals. The decompression engine is to decompress the input data stream by replacing each match with the corresponding past occurrence, so as to produce an output data stream. In replacing a given match with the corresponding past occurrence, the decompression engine is to (i) when the offset indicates that the past occurrence is cached in the cache memory, retrieve the past occurrence from the cache memory, and (ii) when the offset indicates that the past occurrence is not contained in the cache memory, fetch the past occurrence over the host interface from an external memory of the host.

There is also provided, in accordance with and embodiment of the present invention, a decompression method including receiving a compressed input data stream including literals and matches. Each literal represents a data value, and each match represents a respective sequence of literals by a respective offset pointing to a respective past occurrence of the sequence of literals. The input data stream is decompressed by replacing each match with the corresponding past occurrence so as to produce an output data stream. Replacing a given match with the corresponding past occurrence includes (i) when the offset indicates that the past occurrence is cached in the cache memory, retrieving the past occurrence from the cache memory, and (ii) when the offset indicates that the past occurrence is not contained in the cache memory, fetching the past occurrence from an external memory.

The present invention will be more fully understood from the following detailed description of the embodiments thereof, taken together with the drawings in which:

DETAILED DESCRIPTION OF EMBODIMENTS

Overview

Figure 1:
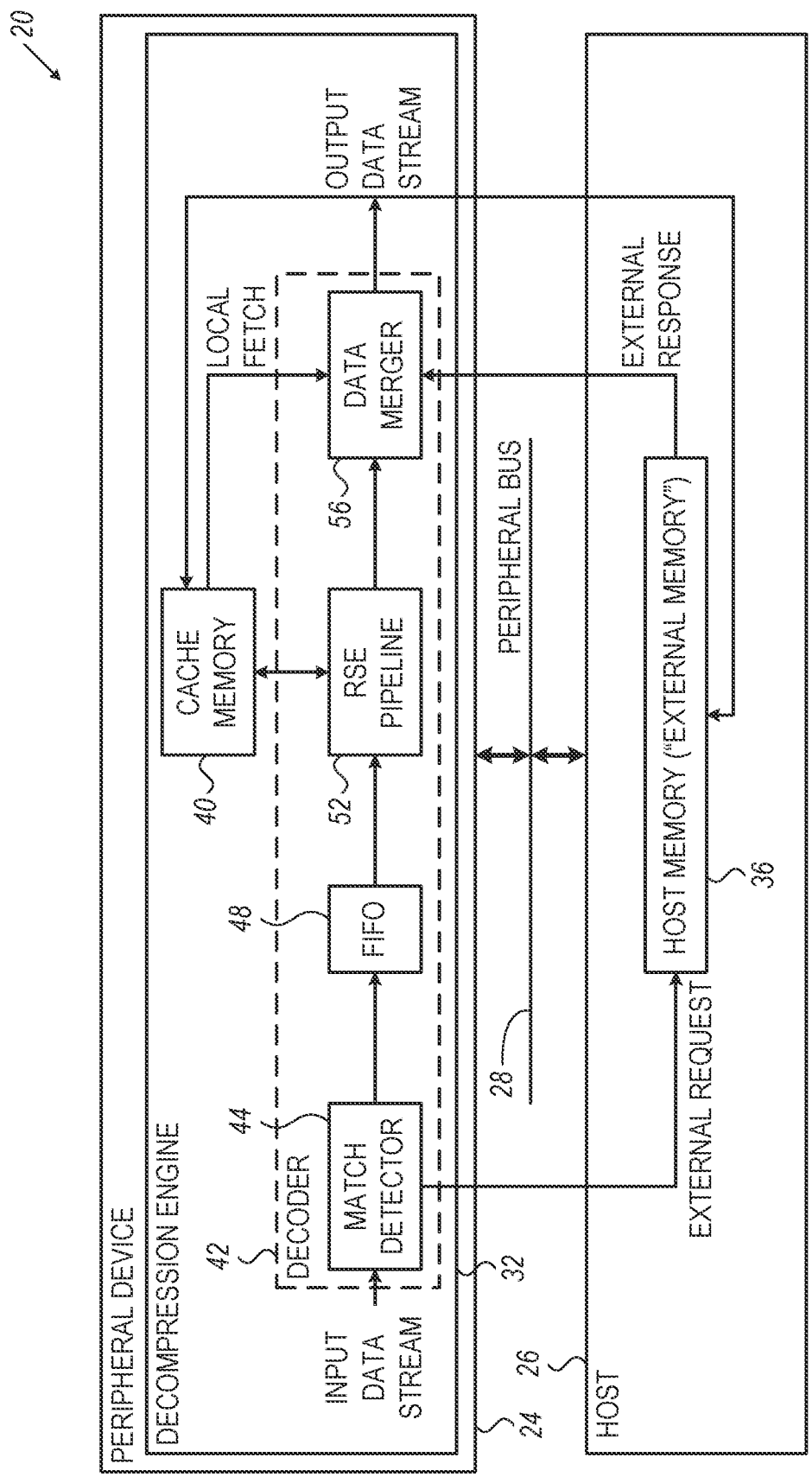
FIG. 1 is a block diagram that schematically illustrates a computing system comprising a decompression engine that supports large match offsets using external memory, in accordance with an embodiment of the present invention.

As noted above, various compression algorithms produce a compressed data stream comprising "literals" and "matches". To decompress such a compressed data stream, a decoder typically replaces each match with the sequence of literals referenced by the match. When implementing a compression/decompression scheme of this sort, one of the limiting factors is the memory depth of the decoder. A larger memory enables storage of a longer history of the decompressed data, and therefore enables the decoder to support matches with larger offsets, improving the compression ratio. With small memory depth, only small match offsets can be supported, meaning occurrences separated by large offsets cannot be compressed. On the other hand, large memory is typically slow to access.

Embodiments of the present invention that are described herein provide improved methods and systems for decompression. The disclosed techniques provide large memory depth and therefore support large match offsets. At the same time, the disclosed techniques avoid most of the latency and throughput degradation associated with large memories.

In some embodiments, a decompression engine comprises a decoder that is coupled to a local cache memory, and is also coupled to communicate with an external memory. The cache memory is considerably smaller than the external memory, but on the other hand considerably faster to access.

The decoder receives a compressed input data stream comprising literals and matches. Each literal represents a data value, and each match replaces a respective sequence of literals by a respective offset pointing to a respective past occurrence of the sequence of literals. The decoder decompresses the input data stream by replacing each match with the corresponding past occurrence, so as to produce an output data stream.

During the decompression process, the decoder writes the decompressed data of the output data stream both to the cache memory and to the external memory. Thus, at any given time, the cache memory holds a relatively small recent portion of the decompressed output data stream, while the external memory holds a much larger portion.

Upon encountering a match in the compressed input data stream, the decoder checks, based on the offset specified in the match, whether the past occurrence pointed-to by the match is cached in the cache memory or not. For example, the decoder may compare the offset to a threshold that depends on the cache size.

If the offset indicates that the past occurrence is cached in the cache memory, the decoder retrieves the past occurrence from the cache memory. If the offset indicates that the past occurrence is not contained in the cache memory, the decoder fetches the past occurrence from an external memory.

In a typical implementation, the cache is dimensioned so that the vast majority of matches can be resolved using the decompressed output data cached in the cache memory. Therefore, the performance degradation and extra power consumption caused by accessing the external memory are incurred only rarely, when the offset is exceedingly large.

System Description

FIG. 1 is a block diagram that schematically illustrates a computing system 20, in accordance with an embodiment of the present invention. System 20 comprises a peripheral device 24 that is connected to a host 26 over a peripheral bus 28. Peripheral device 24 performs data decompression for host 26 using a decompression engine 32, possibly among other tasks.

In the present example, peripheral device 24 is a network adapter that connects host 26 to a network, and in addition offloads the host of various tasks, including decompression. In this embodiment, peripheral device 24 receives, from the network, packets that carry compressed data. Decompression engine 32 decompresses the data and sends the decompressed data to host 26 for further processing. In other embodiments, peripheral device 24 may be, for example, a Graphics Processing Unit (GPU), an accelerator, a storage device, or any other suitable device. Bus 28 may comprise, for example, a Peripheral Component Interconnect express (PCIe) bus, an Nvlink bus or any other suitable peripheral bus. Further alternatively, decompression engine 32 may communicate with the external memory over any other suitable bus, interface or link, e.g., over a network connection. Peripheral device 24 typically comprises a suitable host interface for communicating over bus 28 or other connection.

Decompression engine 32 comprises a cache memory 40 and a decoder 42. Decoder 42 comprises a match detector 44, a First-In First-Out (FIFO) buffer 48, a "Read-Sample-Execute" (RSE) pipeline 52, and a data merger 56. The operation of these elements is described in detail below.

In an embodiment, decoder 42 receives a compressed input data stream, and outputs a decompressed output data stream. The output data stream is sent both to cache memory 40 and to a host memory 36 in host 26. From the perspective of decompression engine 32, host memory 36 serves as an external memory. The terms "host memory" and "external memory" are thus used interchangeably herein. In alternative embodiments, the external memory need not necessarily belong to or reside in the host.

Cache memory 40 is typically much smaller in memory size than external memory 36. In an example embodiment, cache memory 40 comprises a Static Random-Access Memory (SRAM) having a memory size of 64 KB, and external memory 36 comprises a Dynamic Random-Access Memory (DRAM) having a memory size of 4 GB. At a given time, cache memory 40 holds the most recent 64 KB-portion of the decompressed output data stream. At the same time, external memory 36 holds a much larger portion of the decompressed output data stream, e.g., 4 GB. In alternative embodiments, any other suitable memory sizes can be used for cache memory 40 and external memory 36.

The configurations of system 20 and decompression engine 32, as shown in FIG. 1, are example configurations that are chosen purely for the sake of conceptual clarity. In alternative embodiments, any other suitable configurations can be used. For example, decompression engine 32 need not necessarily be implemented in a peripheral device. In alternative embodiments, decompression engine 32 may be part of a storage device, a communication receiver, a computer, or any other suitable device. As another example, decompression engine 32 may access external memory 36 using any other suitable interface, e.g., using Direct Memory Access (DMA), not necessarily over a peripheral bus.

Elements that are not necessary for understanding the principles of the present invention have been omitted from the figures for clarity. The various elements of system 20 and decompression engine may be implemented in hardware, e.g., in one or more Application-Specific Integrated Circuits (ASICs) or FPGAs, in software, or using a combination of hardware and software elements. In some embodiments, Certain elements of decompression engine 32 may be implemented, in part or in full, using one or more general-purpose processors, which are programmed in software to carry out the functions described herein. The software may be downloaded to any of the processors in electronic form, over a network, for example, or it may, alternatively or additionally, be provided and/or stored on non-transitory tangible media, such as magnetic, optical, or electronic memory.

Supporting Large Match Offsets Using External Memory

In a typical mode of operation, decoder 42 receives a compressed input data stream for processing. As explained above, the input data stream comprises a stream of literals and matches. A match represents a certain sequence of literals by pointing to a past occurrence of this sequence in the uncompressed (or decompressed) data stream. The match specifies (i) the length of the sequence, and (ii) the offset to the position of the past occurrence in the uncompressed (or decompressed) data stream.

Upon detecting a match, match detector 44 extracts the offset specified in the match. Based on the offset, detector 44 checks whether or not the past occurrence is cached in cache memory 40. In an example embodiment, detector 44 checks whether the offset is smaller than 64 KB (or a slightly smaller value that offers some margin). If so, the past occurrence is recent enough to be cached in cache 40. If the offset is larger than 64 KB (or a slightly smaller value as noted above) the past occurrence is too old to be found in the cache memory.

If the past occurrence is not cached in cache memory 40, match detector 44 sends a request (denoted "EXTERNAL REQUEST" in the figure) to external memory 36 to fetch the past occurrence. The external request indicates (i) a start address or other suitable value (typically derived from the offset) that is indicative of the location of the past occurrence in the external memory, and (ii) the length of the past occurrence to be fetched. When fetched, the past occurrence (denoted "EXTERNAL RESPONSE" in the figure) is provided to data merger 56.

In an example embodiment, match detector 44 divides the input data stream into chunks. In one implementation, each chunk comprises twenty bytes, but any other suitable chunk size can be used. Detector 44 analyzes each chuck, and produces a respective tag that specifies how the chuck is to be processed by decoder 42. Detector 44 forwards the chunks and the respective tags onwards, to FIFO buffer 48. In an example embodiment, the tag comprises the following information:

An indication of whether or not the chunk contains a match.
If the chunk contains a match, an indication of whether the match is a small-offset match (i.e., a match whose past occurrence is cached in cache memory 40) or a large-offset match (i.e., a match whose past occurrence has to be fetched from external memory 36).

FIFO buffer 48 serves as a delay element that delays the input data stream by a delay that compensates for the expected latency between the external request and the external response. The expected latency comprises the access latency of host memory 36, which in turn comprises the round-trip latency of bus 28. In one example embodiment, the maximum size of FIFO buffer 48 is four-hundred bytes, but any other suitable size can be used.

In some embodiments, the size of FIFO buffer 48 is set to compensate for the maximal possible access latency at the maximal possible rate of the input data stream. In practice, however, this size may be an over-design that incurs unnecessarily high latency. In other embodiments, the size of FIFO buffer 48 can be set to support a data rate that is lower than the maximal possible rate of the input data stream.

RSE pipeline 52 receives the chucks of the input data stream and the corresponding tags from FIFO buffer 48, and processes each chunk in accordance with the respective tag. For example, if the tag indicates that the chunk comprises a small-offset match, RSE pipeline 52 fetches the past occurrence specified in the match from cache memory 40. The fetched data is provided to data merger 56 for insertion into the data stream. If the tag indicates that the chuck comprises a large-offset match, RSE pipeline instructs data merger 56 to wait for the corresponding "EXTERNAL RESPONSE" from external memory 36, and to insert the data provided in the response into the data stream.

Data merger 56 receives the input data stream from pipeline 52. Merger 56 is responsible for (i) replacing each match with the corresponding past occurrence so as to produce the decompressed output data stream, and (ii) sending the decompressed output data stream to cache memory 40 and to external memory 36.

To replace a certain match with the corresponding past occurrence, data merger 56 acts on the instructions received from RSE pipeline 52. If the past occurrence is cached (meaning RSE pipeline 52 has fetched the past occurrence from cache memory 40), merger 56 replaces the match with the fetched data (denoted "LOCAL FETCH" in the figure). If the past occurrence was retrieved from external memory 36, data merger 56 extracts the past occurrence from the "EXTERNAL RESPONSE" arriving over bus 28. In either case, merger 56 inserts the past occurrence into the data stream in place of the match. The resulting decompressed output data stream is sent to external memory 36 and to cache memory 40.

In one example embodiment, decoder 42 can receive the compressed input data stream at a rate of up to eight literals per clock cycle, and produce the decompressed output data stream at a rate of up to 32 bytes per clock cycle. The writes to external memory 36 and to cache memory 40, issued by data merger 56 are thirty-two bytes in size each. In some embodiments, data merger may accumulate data for writing until filling a 32-byte unit, and only then write the data to the cache memory or to the external memory. In this embodiment, the "EXTERNAL RESPONSE" messages and the reads from cache memory 40 are also thirty-two bytes in size each. In alternative embodiments, any other suitable data sizes can be used.

Figure 2:
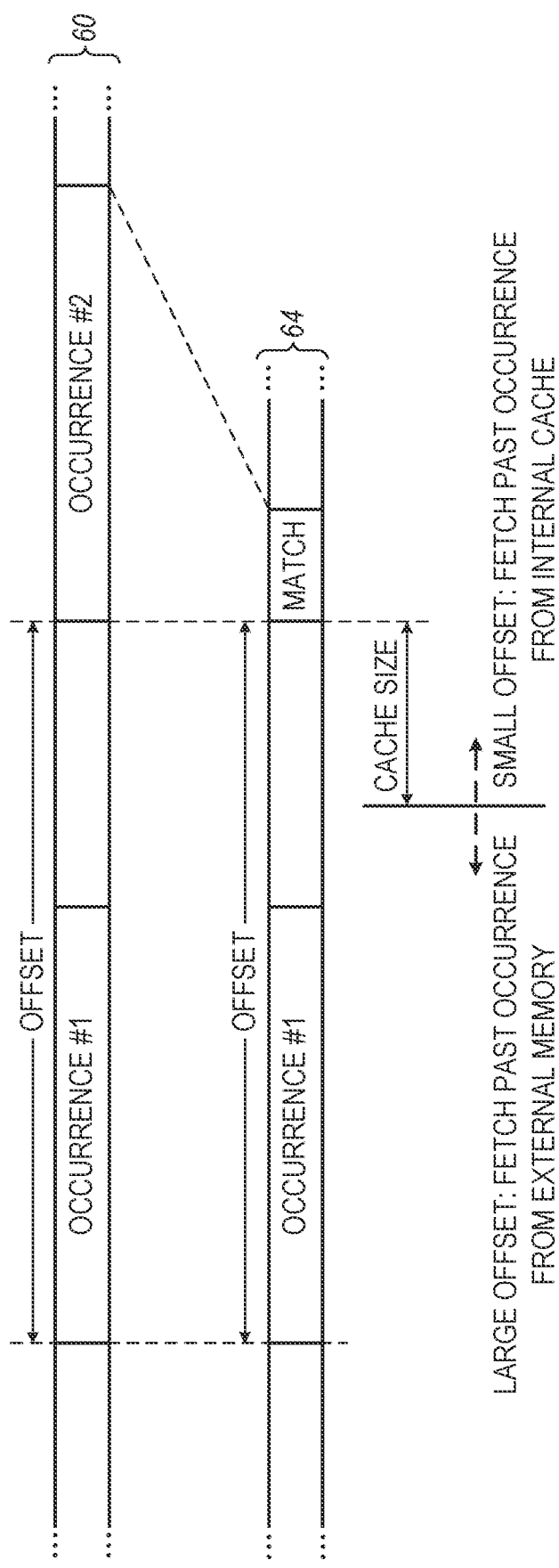
FIG. 2 is a diagram that schematically illustrates the operation of the decompression engine of FIG. 1, in accordance with an embodiment of the present invention.

FIG. 2 is a diagram that schematically illustrates the operation of decompression engine 32 of FIG. 1, in accordance with an embodiment of the present invention. The figure shows an example of an uncompressed data stream 60 and a corresponding compressed data stream 64. Compressed data stream 64 would typically be produced by an encoder of the applicable compression scheme. A stream such as stream 64 would be provided as input to decompression engine 32.

In the present example, uncompressed data stream 60 comprises a stream of literals (e.g., data bytes). A certain a certain sequence of literals occurs twice (denoted "OCCURRENCE #1" and "OCCURRENCE #2" in the figure) in the input data stream. The offset between the two occurrences is denoted "OFFSET" in the figure. In compressed data stream 64, the second occurrence ("OCCURRENCE #2") was replaced by a match that points to the first occurrence ("OCCURRENCE #1"). The match specifies the offset ("OFFSET") and the length of the sequence.

The operation of decoder 42 is visualized below stream 64. If the offset is small enough so that "OCCURRENCE #1" is still cached in cache memory 40, decoder 42 fetches "OCCURRENCE #1" from the cache memory. If the offset is large, i.e., if "OCCURRENCE #1" is no longer cached in cache memory 40, decoder 42 fetches "OCCURRENCE #1" from external memory 36.

Figure 3:
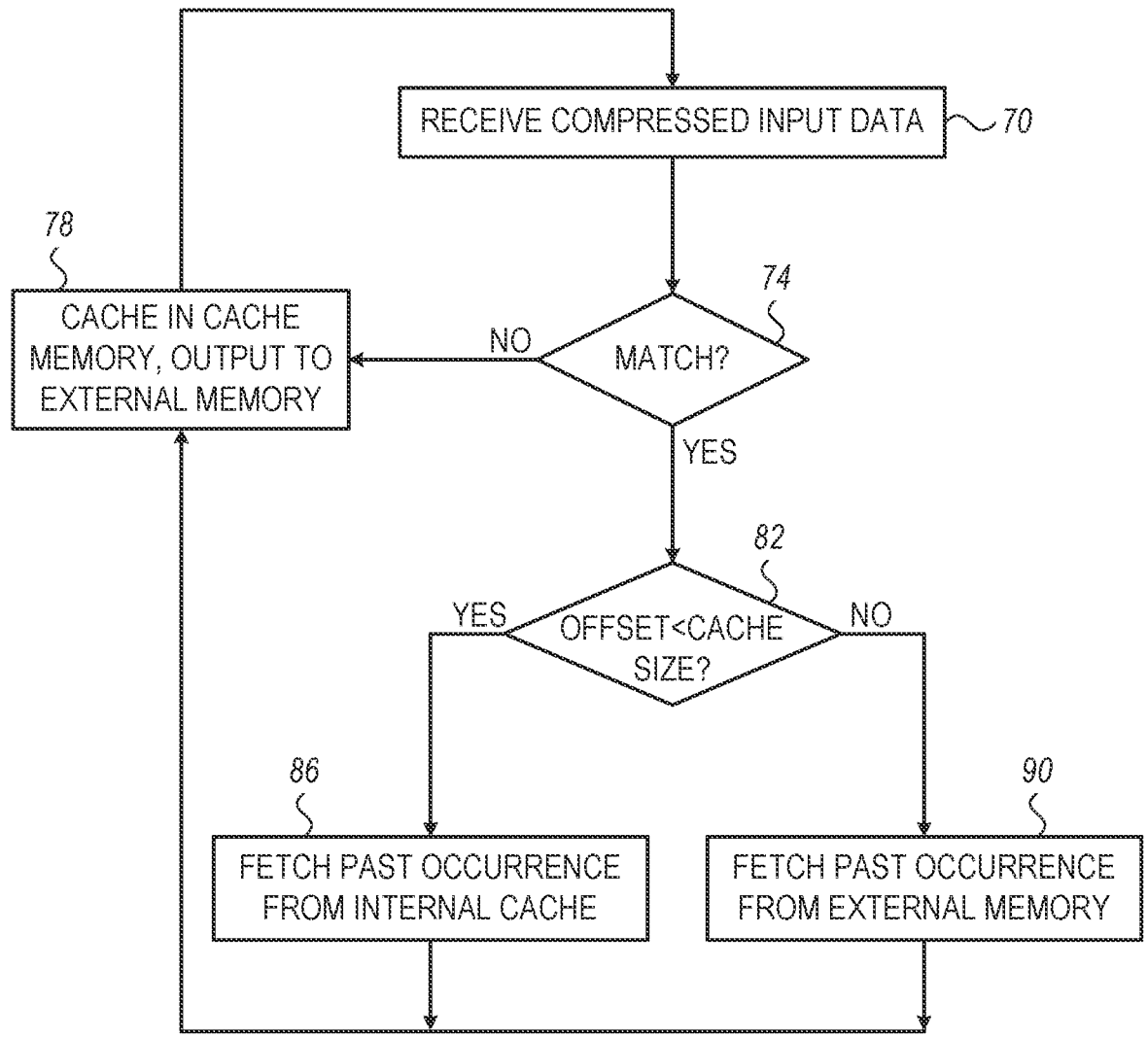
FIG. 3 is a flow chart that schematically illustrates a method for data decompression, in accordance with an embodiment of the present invention.

FIG. 3 is a flow chart that schematically illustrates a method for data decompression, in accordance with an embodiment of the present invention. The method begins with decoder 42 of decompression engine 32 receiving compressed input data belonging to a compressed input data stream, at an input stage 70. At a match detection 74, decoder 42 checks whether a match is found in the input data. If not, decoder 42 passes the data to cache memory 40 and to external memory 36, at an output stage 78.

If a match is detected, decoder 42 examines the offset specified in the match. At an offset checking stage 82, decoder 42 checks whether the offset indicates that the past occurrence (of the sequence of literals represented by the match) is cached in cache memory 40. If so, decoder 42 fetches the past occurrence from cache memory 40, at a local fetching stage 86. If not, decoder 42 fetches the past occurrence from external memory 36, at an external fetching stage 90.

Upon fetching the past occurrence, either from the cache or from the external memory, decoder 42 inserts the past occurrence in place of the match. The method then proceeds to output stage 78, in which decoder 42 outputs the past occurrence to cache memory 40 and to external memory 36.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A decompression method, comprising:
receiving a compressed input data stream comprising literals and matches, wherein (i) each literal represents a data value, and (ii) each match represents a respective sequence of literals by a respective offset pointing to a respective past occurrence of the sequence of literals;
decompressing the input data stream by replacing each match with the corresponding past occurrence so as to produce an output data stream; and
outputting, by a decompression engine, the output data stream to an external memory and to a cache memory,
wherein replacing a given match with the corresponding past occurrence comprises:
when the offset indicates that the past occurrence is cached in the cache memory, retrieving the past occurrence from the cache memory; and
when the offset indicates that the past occurrence is not contained in the cache memory, fetching the past occurrence from the external memory.

2. The method according to claim 1, and comprising deciding whether or not the past occurrence is cached in the cache memory, by comparing the offset to a threshold.

3. The method according to claim 1, wherein decompressing the input data stream comprises:
detecting the given match in the input data stream and sending a request for the corresponding past occurrence to the external memory;
delaying the input data stream at least by an access latency of the external memory; and
merging the past occurrence fetched from the external memory into the delayed input data stream, thereby producing the output data stream.

4. The method according to claim 1, wherein fetching the past occurrence from the external memory comprises communicating with the external memory over a peripheral bus.

5. The method according to claim 1, wherein fetching the past occurrence from the external memory comprises communicating with the external memory over a network connection.

6. A decompression apparatus, comprising:
a cache memory; and
a decoder, to:
receive a compressed input data stream comprising literals and matches, wherein (i) each literal represents a data value, and (ii) each match represents a respective sequence of literals by a respective offset pointing to a respective past occurrence of the sequence of literals;
decompress the input data stream by replacing each match with the corresponding past occurrence, so as to produce an output data stream; and
output the output data stream to an external memory and to the cache memory,
wherein, in replacing a given match with the corresponding past occurrence, the decoder is to:
when the offset indicates that the past occurrence is cached in the cache memory, retrieve the past occurrence from the cache memory; and
when the offset indicates that the past occurrence is not contained in the cache memory, fetch the past occurrence from the external memory.

7. The apparatus according to claim 6, wherein the decoder is to decide whether or not the past occurrence is cached in the cache memory, by comparing the offset to a threshold.

8. The apparatus according to claim 6, wherein the decoder comprises:
a match detector, to detect the given match in the input data stream and send a request for the corresponding past occurrence to the external memory;
a delay buffer, to delay the input data stream at least by an access latency of the external memory; and a data merger coupled to an output of the delay buffer, the data merger to merge the past occurrence fetched from the external memory into the delayed input data stream, thereby producing the output data stream.

9. The apparatus according to claim 6, wherein the decoder is to fetch the past occurrence from the external memory by communicating with the external memory over a peripheral bus.

10. The apparatus according to claim 6, wherein the decoder is to fetch the past occurrence from the external memory by communicating with the external memory over a network connection.

11. A decompression apparatus, comprising:
a cache memory; and
a decoder, to:
  receive a compressed input data stream comprising literals and matches, wherein (i) each literal represents a data value, and (ii) each match comprises an offset value pointing to a corresponding past occurrence of a respective sequence of literals;
  decompress the input data stream by replacing each match with the corresponding past occurrence, so as to produce an output data stream; and
  output the output data stream to an external memory and to the cache memory,
  wherein, in replacing a given match with the corresponding past occurrence, the decoder is to:
    when the offset indicates that the past occurrence is cached in the cache memory, retrieve the past occurrence from the cache memory; and
    when the offset indicates that the past occurrence is not contained in the cache memory, fetch the past occurrence from the external memory.

12. A peripheral device, comprising:
a host interface, to communicate with a host; and
a decompression engine comprising a cache memory, the decompression engine to:
  receive a compressed input data stream comprising literals and matches, wherein (i) each literal represents a data value, and (ii) each match represents a respective sequence of literals by a respective offset pointing to a respective past occurrence of the sequence of literals;
  decompress the input data stream by replacing each match with the corresponding past occurrence, so as to produce an output data stream; and
  output the output data stream to an external memory of the host and to the cache memory,
  wherein, in replacing a given match with the corresponding past occurrence, the decompression engine is to:
    when the offset indicates that the past occurrence is cached in the cache memory, retrieve the past occurrence from the cache memory; and
    when the offset indicates that the past occurrence is not contained in the cache memory, fetch the past occurrence over the host interface from the external memory.

13. The peripheral device according to claim 12, wherein the decompression engine is to decide whether or not the past occurrence is cached in the cache memory, by comparing the offset to a threshold.

14. The peripheral device according to claim 12, wherein the decompression engine comprises:
  a match detector, to detect the given match in the input data stream and send a request for the corresponding past occurrence to the external memory;
  a delay buffer, to delay the input data stream at least by an access latency of the external memory; and
  a data merger coupled to an output of the delay buffer, the data merger to merge the past occurrence fetched from the external memory into the delayed input data stream, thereby producing the output data stream.

15. The peripheral device according to claim 12, wherein the decompression engine is to fetch the past occurrence from the external memory by communicating with the external memory over a peripheral bus.

16. The peripheral device according to claim 12, wherein the decompression engine is to fetch the past occurrence from the external memory by communicating with the external memory over a network connection.

* * * * *